US009018561B2

(12) United States Patent
Sandstrom et al.

(10) Patent No.: US 9,018,561 B2
(45) Date of Patent: Apr. 28, 2015

(54) HIGH POWER SEED/AMPLIFIER LASER SYSTEM WITH BEAM SHAPING INTERMEDIATE THE SEED AND AMPLIFIER

(75) Inventors: Richard L Sandstrom, San Diego, CA (US); Daniel J. W. Brown, San Diego, CA (US); Thomas Hoffmann, San Diego, CA (US); Jason D Robinson, San Diego, CA (US); Craig W Unick, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 1279 days.

(21) Appl. No.: 12/284,031

(22) Filed: Sep. 17, 2008

(65) Prior Publication Data

US 2009/0116530 A1 May 7, 2009

Related U.S. Application Data

(63) Continuation-in-part of application No. 11/805,596, filed on May 23, 2007.

(51) Int. Cl.
*B23K 26/00* (2014.01)
*C30B 13/24* (2006.01)
(Continued)

(52) U.S. Cl.
CPC .............. *C30B 13/24* (2013.01); *B23K 26/063* (2013.01); *B23K 26/0738* (2013.01); *C30B 29/06* (2013.01); *H01L 21/67115* (2013.01)

(58) Field of Classification Search
CPC ........... B23K 26/0626; B23K 26/0639; B23K 26/0635; B23K 26/063
USPC ........ 250/201.9, 205, 206.1, 214 LA, 227.11, 250/203.1, 216, 236; 219/121.65, 121.83, 219/121.61, 121.69, 121.72, 121.85; 372/55, 57, 61; 359/333, 337, 342, 359/349, 212.2, 220.1, 350
See application file for complete search history.

(56) References Cited

U.S. PATENT DOCUMENTS 3,330,958 A * 7/1967 Kaisler et al. ................ 250/216
4,081,207 A * 3/1978 Dippel ....................... 359/196.1
(Continued)

FOREIGN PATENT DOCUMENTS

EP 0341960 A2 11/1989 ................ G01J 9/02
EP 1102368 A2 5/2001 ............... H01S 3/081
(Continued)

OTHER PUBLICATIONS

Zhang, A. et al., "Novel Detecting Methods of Shack-Hartmann Wavefront Sensor at Low Light Levels," *International Symposium on Instrumentation Science and Technology*, J. of Physics: Conference Series 48, pp. 190-195 (2006).
(Continued)

*Primary Examiner* — Brett Spurlock
(74) *Attorney, Agent, or Firm* — Martine Penilla Group, LLP

(57) ABSTRACT

An apparatus and method of operation for a high power broad band elongated thin beam laser annealing light source, which may comprise a gas discharge seed laser oscillator having a resonance cavity, providing a seed laser output pulse; a gas discharge amplifier laser amplifying the seed laser output pulse to provide an amplified seed laser pulse output; a divergence correcting multi-optical element optical assembly intermediate the seed laser and the amplifier laser. The divergence correcting optical assembly may adjust the size and/or shape of the seed laser output pulse within a discharge region of the amplifier laser in order to adjust an output parameter of the amplified seed laser pulse output. The divergence correcting optical assembly may comprise a telescope with an adjustable focus. The adjustable telescope may comprise an active feedback-controlled actuator based upon a sensed parameter of the amplified seed laser output from the amplifier laser.

33 Claims, 6 Drawing Sheets

(51) Int. Cl.
*B23K 26/06* (2014.01)
*B23K 26/073* (2006.01)
*C30B 29/06* (2006.01)
*H01L 21/67* (2006.01)

(56) References Cited

U.S. PATENT DOCUMENTS

| | | | |
|---|---|---|---|
| 4,368,080 A * | 1/1983 | Langen et al. | 134/1 |
| 4,377,736 A * | 3/1983 | Daunt et al. | 219/121.68 |
| 4,461,947 A * | 7/1984 | Ward | 219/121.84 |
| 4,693,555 A * | 9/1987 | Arai et al. | 359/820 |
| 4,792,690 A | 12/1988 | McCann et al. | 250/474.1 |
| 4,945,527 A * | 7/1990 | Sunagawa | 369/44.12 |
| 5,095,492 A | 3/1992 | Sandstrom | 372/102 |
| 5,184,103 A * | 2/1993 | Gadreau et al. | 336/84 C |
| 5,185,676 A * | 2/1993 | Nishiberi | 359/202.1 |
| 5,457,707 A * | 10/1995 | Sobey et al. | 372/20 |
| 5,521,573 A * | 5/1996 | Inoh et al. | 336/180 |
| 5,557,446 A * | 9/1996 | Kato | 359/206.1 |
| 5,557,471 A * | 9/1996 | Fernandez | 359/709 |
| 5,613,749 A * | 3/1997 | Shikama et al. | 353/102 |
| 5,625,189 A * | 4/1997 | McCaul et al. | 250/343 |
| 5,636,035 A * | 6/1997 | Whittaker et al. | 356/437 |
| 5,677,796 A * | 10/1997 | Zimmerman et al. | 359/654 |
| 5,684,642 A * | 11/1997 | Zumoto et al. | 359/740 |
| 5,750,986 A * | 5/1998 | Genovese | 250/235 |
| 5,822,091 A * | 10/1998 | Baker | 359/10 |
| 5,828,483 A * | 10/1998 | Schwartz et al. | 359/216.1 |
| 5,847,820 A * | 12/1998 | Hamar | 356/139.1 |
| 5,864,430 A * | 1/1999 | Dickey et al. | 359/559 |
| 5,880,465 A * | 3/1999 | Boettner et al. | 250/234 |
| 5,886,822 A * | 3/1999 | Spitzer | 359/630 |
| 5,892,570 A * | 4/1999 | Stevens | 351/237 |
| 5,896,233 A * | 4/1999 | Soda et al. | 359/635 |
| 5,917,654 A * | 6/1999 | Dunn | 359/614 |
| 5,952,909 A * | 9/1999 | Umeno et al. | 336/192 |
| 5,970,082 A | 10/1999 | Ershov | 372/57 |
| 6,000,128 A * | 12/1999 | Umeno et al. | 29/846 |
| 6,028,722 A | 2/2000 | Lang | 359/834 |
| 6,053,409 A | 4/2000 | Brobst et al. | 234/462.36 |
| 6,094,448 A | 7/2000 | Fomenkov et al. | 372/102 |
| 6,192,064 B1 * | 2/2001 | Algots et al. | 372/99 |
| 6,256,154 B1 * | 7/2001 | Kubota et al. | 359/728 |
| 6,281,779 B1 * | 8/2001 | Matsumoto et al. | 336/200 |
| 6,285,508 B1 * | 9/2001 | Ai et al. | 359/664 |
| 6,292,285 B1 * | 9/2001 | Wang et al. | 359/204.1 |
| 6,339,608 B1 | 1/2002 | Ault | 372/51 |
| 6,396,062 B1 | 5/2002 | Buck et al. | 250/372 |
| 6,493,374 B1 | 12/2002 | Fomenkov et al. | 372/102 |
| 6,504,975 B1 * | 1/2003 | Yamagata et al. | 385/33 |
| 6,509,973 B2 * | 1/2003 | Kiyoi et al. | 356/606 |
| 6,556,612 B2 | 4/2003 | Ershov et al. | 372/103 |
| 6,567,435 B1 * | 5/2003 | Scott et al. | 372/29.021 |
| 6,567,450 B2 * | 5/2003 | Myers et al. | 372/55 |
| 6,625,191 B2 | 9/2003 | Knowles et al. | 372/55 |
| 6,706,999 B1 * | 3/2004 | Barrett et al. | 219/121.74 |
| 6,721,101 B2 * | 4/2004 | Daniell | 359/626 |
| 6,801,561 B2 | 10/2004 | Kleinschmidt | 372/57 |
| 6,813,294 B2 * | 11/2004 | Ono et al. | 372/43.01 |
| 6,829,000 B2 * | 12/2004 | Assa et al. | 347/257 |
| 6,879,379 B2 * | 4/2005 | Brunotte et al. | 355/53 |
| 6,904,073 B2 | 6/2005 | Yager et al. | 372/57 |
| 6,908,196 B2 | 6/2005 | Herekar et al. | 351/221 |
| 7,177,340 B2 | 2/2007 | Lang et al. | 372/102 |
| 7,317,179 B2 * | 1/2008 | Akins et al. | 250/201.1 |
| 7,894,044 B1 * | 2/2011 | Sullivan | 356/4.01 |
| 2003/0210391 A1 * | 11/2003 | Uto et al. | 356/237.1 |
| 2004/0057489 A1 * | 3/2004 | Fallon et al. | 372/57 |
| 2004/0109167 A1 * | 6/2004 | Sandstrom | 356/519 |
| 2004/0141180 A1 * | 7/2004 | Wan | 356/450 |
| 2005/0100072 A1 * | 5/2005 | Rao et al. | 372/55 |
| 2005/0143814 A1 * | 6/2005 | Esch et al. | 623/6.22 |
| 2005/0259709 A1 * | 11/2005 | Das et al. | 372/55 |
| 2005/0271109 A1 * | 12/2005 | Knowles et al. | 372/57 |
| 2006/0126697 A1 * | 6/2006 | Knowles et al. | 372/55 |
| 2006/0269190 A1 * | 11/2006 | Kim et al. | 385/43 |
| 2007/0001127 A1 | 1/2007 | Reiley et al. | 250/492.2 |
| 2007/0016074 A1 * | 1/2007 | Abreu | 600/475 |
| 2007/0096008 A1 * | 5/2007 | Akins et al. | 250/201.1 |
| 2007/0133650 A1 * | 6/2007 | Kim et al. | 372/102 |
| 2007/0195836 A1 | 8/2007 | Dunstan et al. | 372/32 |
| 2007/0278193 A1 | 12/2007 | Hofmann | 219/121.6 |
| 2007/0280311 A1 | 12/2007 | Hofmann | 372/30 |
| 2009/0102956 A1 * | 4/2009 | Georgiev | 348/315 |
| 2010/0315935 A1 * | 12/2010 | Horinouchi et al. | 369/112.24 |

FOREIGN PATENT DOCUMENTS

| | | | |
|---|---|---|---|
| EP | 0955706 B1 | 9/2001 | H01S 3/08 |
| EP | 2166626 A1 | 3/2010 | H01S 3/00 |
| WO | WO 01/59414 | 8/2001 | G01J 1/42 |

OTHER PUBLICATIONS

PCT Search Report dated Dec. 1, 2009, International Patent Application No. PCT/US09/05171 filed Sep. 16, 2009 (8 pages).

* cited by examiner

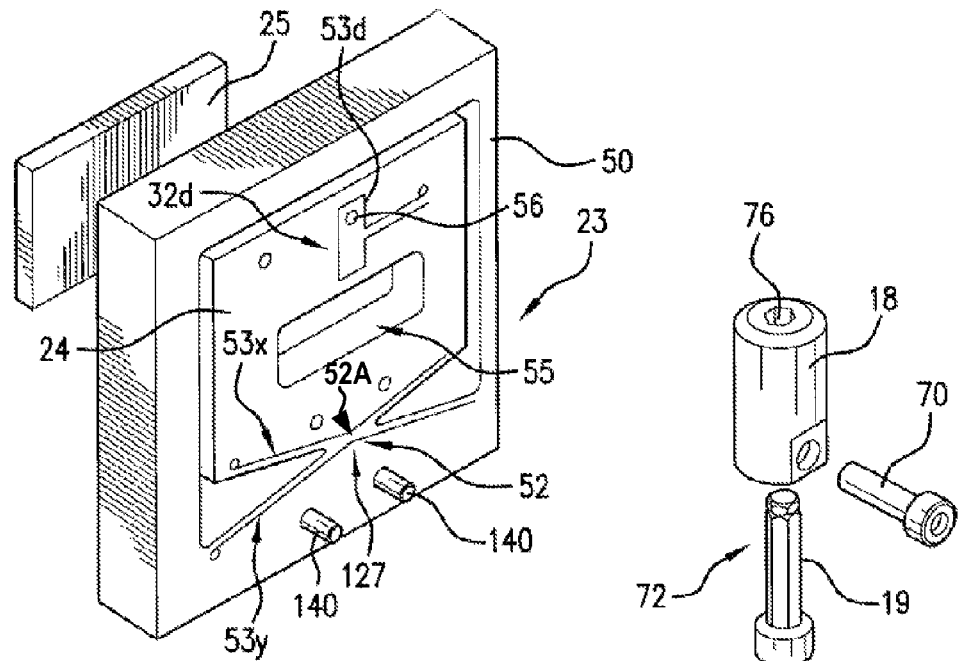
FIG. 1
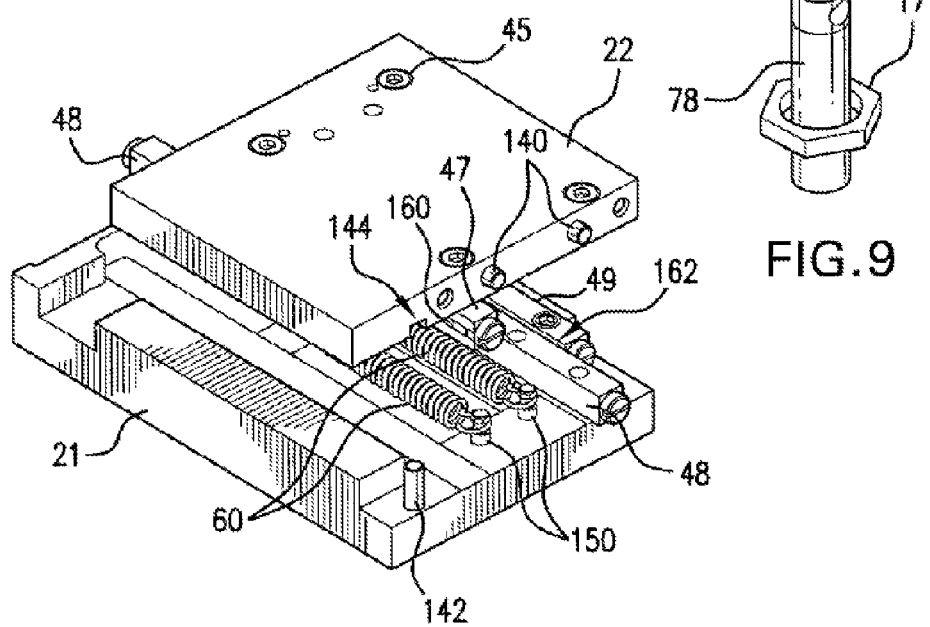
FIG. 2
FIG. 9

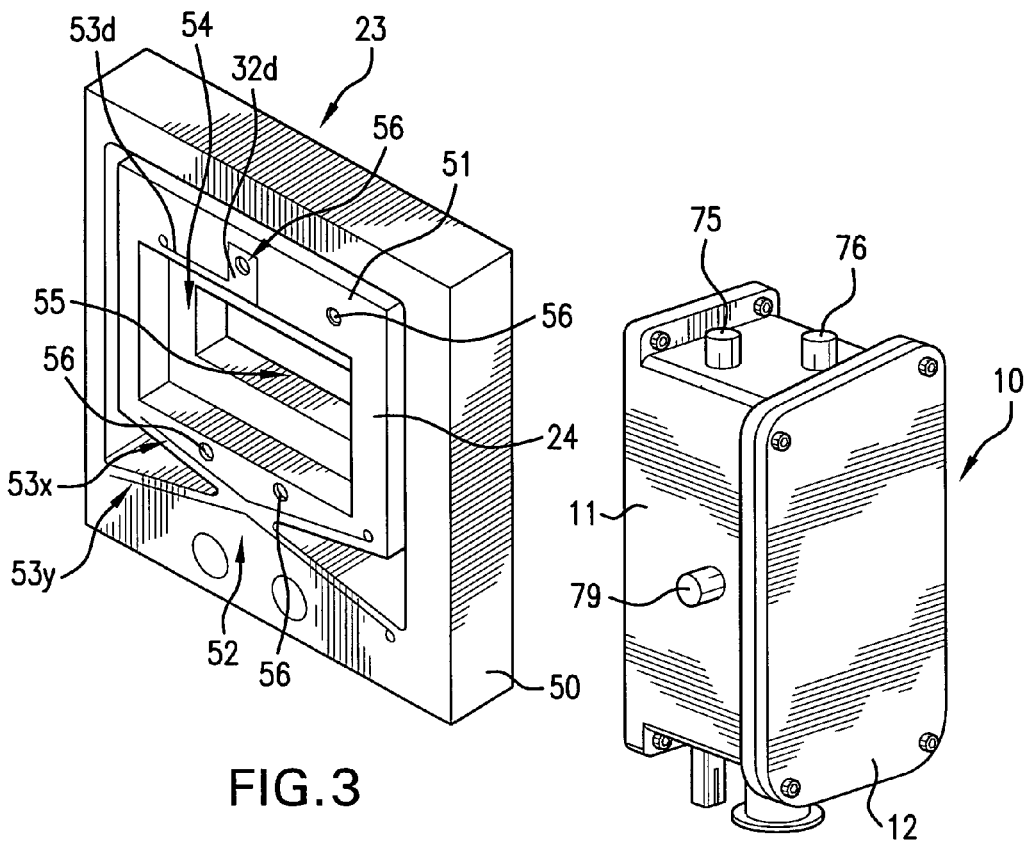
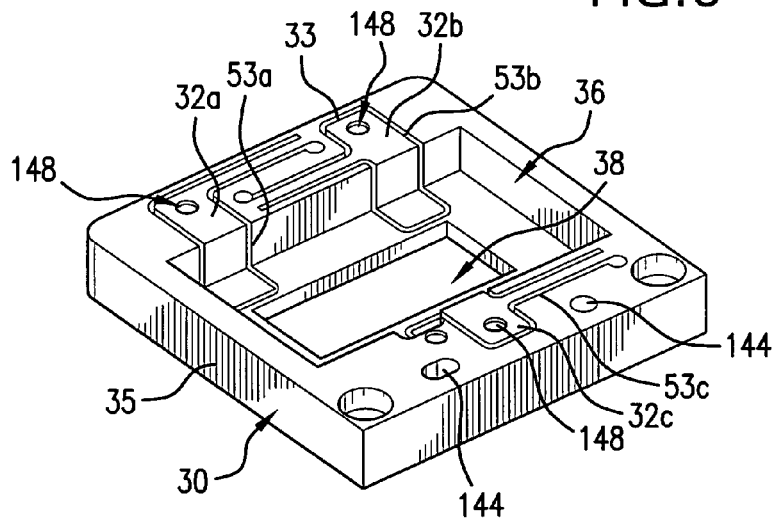

HIGH POWER SEED/AMPLIFIER LASER SYSTEM WITH BEAM SHAPING INTERMEDIATE THE SEED AND AMPLIFIER

RELATED CASES

The present application is a continuation-in-part of U.S. patent application Ser. No. 11/805,596, filed on May 23, 2007, entitled Device and Method to Create a Low Divergence, High Power Laser Beam for Material Processing Applications, the disclosure of which is hereby incorporated by reference. The present application is related to U.S. Published patent Application, Pub. No. 20070278193, entitled DEVICE AND METHOD TO CREATE LOW DIVERGENCE, HIGH POWER LASER BEAM FOR MATERIAL PROCESSING APPLICATIONS, published on Dec. 6, 2007, assigned to the common assignee of the present application, the disclosure of which along with the applications and/or patents disclosed in the RELATED CASES section of that application, are hereby incorporated by reference.

FIELD

The present invention relates to very high power gas discharge laser systems supplying UV light for manufacturing purposes, e.g., for laser annealing of a layer of amorphous silicon to form a layer of polycrystalline silicon, e.g., for forming a thin film transistor panel.

BACKGROUND

U.S. Pat. No. 6,625,191 entitled VERY NARROW BAND, TWO CHAMBER, HIGH REP RATE GAS DISCHARGE LASER SYSTEM, issued to Knowles, et al., on Sep. 23, 2003 (Col. 24) and U.S. Pat. No. 6,567,450, entitled VERY NARROW BAND, TWO CHAMBER, HIGH REP RATE GAS DISCHARGE LASER SYSTEM, issued to Myers, et al., on May 20, 2003 (Col. 18, lines 10-45), disclose a spatial filter between a seed laser and amplifier laser to control bandwidth, which is also said to be able to control beam size transitioning the amplifier.

U.S. Pat. Nos. 4,792,690, 6,396,062, European Published Patent Application No. WO/2001/059414, Lawrence I. Green, "New methods for characterization of laser beams for improved performance", presented at the Automotive Laser Applications Workshop (ALAW), Dearborn, Mich. (March, 2002) relate to measuring beam parameters, such as beam profile, pointing and divergence and the like, directly or indirectly. SinTec Optronics sells a monitor for measuring UV laser light beam divergence. Measurement of beam divergence can involve measuring the beam radius at different positions, using, e.g., a beam profiler.

As discussed in A. Zhang, et al., "Novel Detecting Methods of Shack-Hartmann Wavefront Sensor at Low Light Levels," International Symposium on Instrumentation Science and Technology, Journal of Physics: Conference Series 48, pp. 190-195 (2006), a Shack-Hartmann wavefront sensor ("SHWFS") may be composed of a micro-lens array, a matching lens and a CCD camera. The wavefront can be brought to separate foci producing an array of spots in the focal plane. Wavefront gradients can determine divergence, e.g., through using Zernike polynomials, such as annular Zernikes.

Adjusting an optical element, e.g., in the optical train forming a resonance cavity of an oscillator laser and/or the wavefront of the light in the cavity can, e.g., enhance the operation of a line narrowing module improving bandwidth, as discussed in, e.g., U.S. Pat. No. 6,556,612, issued on Apr. 29, 2003, to Ershov, et al., entitled LINE NARROWED LASER WITH SPATIAL FILTER and 6567450, issued on May 20, 2003, to Myers, et al., entitled VERY NARROW BAND, TWO CHAMBER, HIGH REP RATE GAS DISCHARGE LASER SYSTEM, as well as U.S. Pat. Nos. 5,095,492, 5,970,082, 6,094,448, 6,493,374, 6,496,528, 6,778,584 and 7154928, disclosing various apparatus and methods for modifying the interaction of the wavefront of the laser light and/or the dispersive face of the dispersive optic, including a deformable center wavelength selection mirror.

According to the on-line Encyclopedia of Laser Technology, edited by Dr. Rudiger Paschotta, http://www.rp-photonics.com/encyclopedia.html, different quantitative definitions of beam divergence are common. Encyclopedia of Laser Technology, Rudiger Paschotta, Ed., http://www.rp-photonics.com/encyclopedia.html. One definition is the derivative of the beam radius with respect to the axial position in the far field distance from the waist, which can also depend on the definition of beam radius. For Gaussian beams, one normally uses a beam radius definition based on the point with $1/e^2$ times the maximum intensity. For non-Gaussian profiles, an integral formula can be used. Beams with very small divergence, i.e., with approximately constant beam radius over significant propagation distances, are called collimated beams.

The above referenced '193 Published Patent Application discloses a set and forget lens arrangement divergence control mechanism intermediate a seed laser and amplifier laser for laser annealing applications to create a converging beam entering the amplifier laser to funnel more of the beam into the amplifier discharge region to increase output beam pulse energy and to improve the output collimation entering the annealing apparatus optical train, by matching the negative lens effect of the discharge in the amplifier discharge region.

Applicants propose improvements in the ability to periodically and/or actively control seed beam parameters, including divergence, beam shape and size and wavefront within the amplifier gain medium as the seed beam is amplified in the amplifier laser portion of a seed laser/amplifier laser arrangement, in order to improve output parameters of the amplifier laser such as pulse energy, and divergence, through an adjustable control of such beam divergence/wavefront and/or beam shaping and sizing between the seed laser and amplifier laser. In this manner, applicants propose to modify at least one output parameter of the amplifier laser to improve the ability to optically manipulate the output beam from the amplifier laser to form an elongated very narrow beam for such applications as laser annealing, e.g., for crystallizing thin films for the better formation of thin film transistors, OLEDs and the like in the crystallized thin film. This may make the cost of manufacturing a variety of types of such things as flat panel displays more uniform and economical.

SUMMARY

An apparatus and method of operation is disclosed for a high power broad band elongated thin beam laser annealing light source which may comprise a gas discharge seed laser oscillator having a resonance cavity, providing a seed laser output pulse; a gas discharge amplifier laser amplifying the seed laser output pulse to provide an amplified seed laser pulse output; a divergence correcting multi-optical element optical assembly intermediate the seed laser and the amplifier laser. The divergence correcting optical assembly may adjust the size and/or shape of the seed laser output pulse within a discharge region of the amplifier laser in order to adjust an output parameter of the amplified seed laser pulse output. The divergence correcting optical assembly may comprise a telescope with an adjustable focus. The adjustable telescope may comprise an active feedback controlled actuator based upon a sensed parameter of the amplified seed laser output from the amplifier laser.

BRIEF DESCRIPTION OF THE DRAWINGS

FIG. 1 shows a front perspective and partly schematic view of a portion of a telescope mounting system according to aspects of an embodiment of the disclosed subject matter;

FIG. 2 shows a partly exploded perspective and partly schematic view of a portion of a telescope mounting system according to aspects of an embodiment of the disclosed subject matter;

FIG. 3 shows a rear perspective and partly schematic view of the portion of a telescope mounting system according to aspects of an embodiment of the disclosed subject matter shown in FIG. 1;

FIG. 4 shows a perspective and partly schematic view of a portion of a telescope mounting system according to aspects of an embodiment of the disclosed subject matter;

FIG. 5 shows a perspective view of a portion of a telescope mounting system according to aspects of an embodiment of the disclosed subject matter;

FIG. 9 shows an exploded perspective view of an example of a through the wall adjustment mechanism according to aspects of an embodiment of the disclosed subject matter;

DETAILED DESCRIPTION OF THE DISCLOSED SUBJECT MATTER

Figure 6:
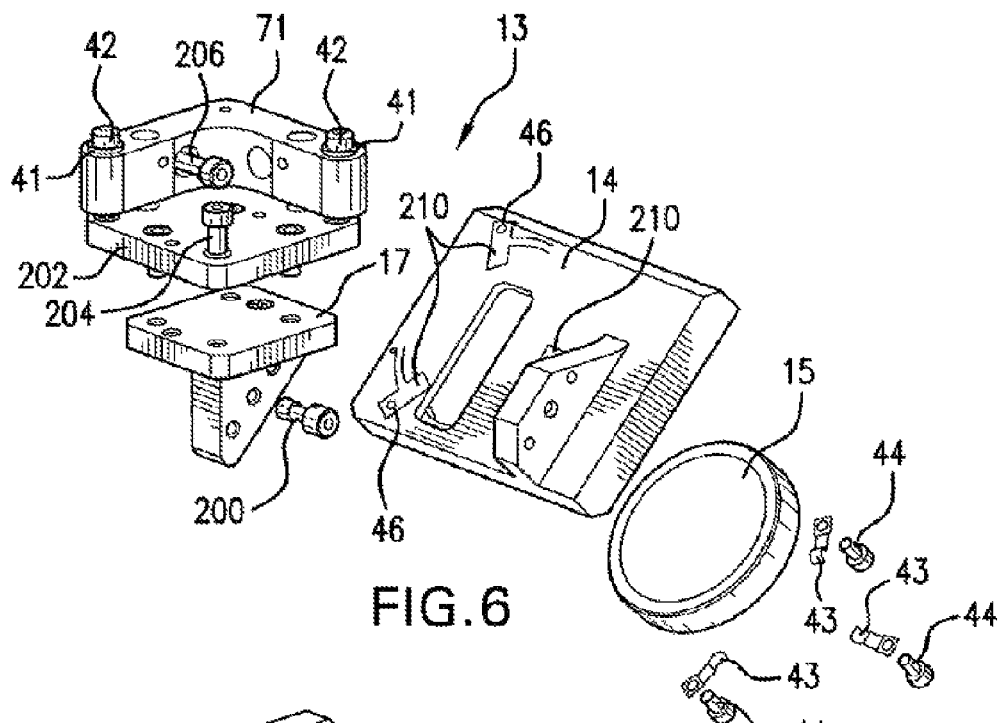
FIG. 6 shows a partly exploded perspective and partly schematic view of a portion of a telescope mounting system according to aspects of an embodiment of the disclosed subject matter.

A laser operating on a single transverse resonator mode (fundamental resonator mode—usually Gaussian) can have a diffraction-limited output. Intracavity beam distortions, e.g., in the gain medium, can result in non-ideal beam quality (deformation of the fundamental mode or transverse multi-mode operation). For a diffraction-limited Gaussian beam divergence may result, which, along with beam radius may be measured using various kinds of beam profilers such as a Shack Hartmann beam profiler and/or various camera arrangements.

Turning now to FIG. 1, there is shown a perspective partly-exploded view of a telescope optic rotational flexure mount 23, an opposite perspective view of which may be seen in FIG. 3. The telescope optic rotational flexure mount 23 may include a telescope lens flexure mount body 24, to which may be attached, by suitable lens mounting clamps (not shown in FIG. 1, and as discussed below), a lens 25, such as, an $SiO_2$ 40×25.4 mm 100 mm radius 351 nm plano-concave recti-cylindrical lens. The lens 25 may form one end of an adjustable telescope for focusing and collimating the output of a seed laser 224, such as, is illustrated schematically and in block diagram form in FIG. 13, entering an amplifier laser 262, for, among other things, beam shaping and sizing and divergence reduction of the beam being amplified in intensity in the amplifier laser 262.

The telescope optic rotational flexure mount 23 may also include a telescope optic rotational mount frame 50, within which may be contained the mount body 24 attached to the frame 50 by a crossed flexure assembly flexure mount 52. The flexure mount 52 may comprise a slot 53x and a slot 53y, together forming a crossed flexure mount 52 that can allow the lens flexure mount body 24 to rotate essentially around the point 52A intermediate where the slots 53x and 53y pass each other, and at a point 52A where the slots 53x and 53y virtually cross each other adjacent the apex of a frame triangular protuberance 127.

Figure 12:
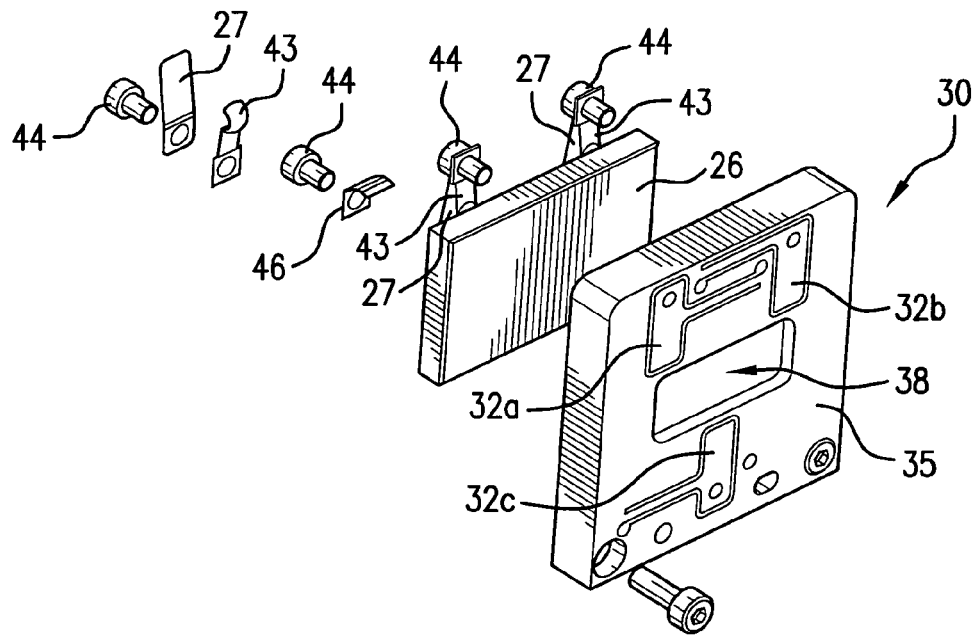
FIG. 12 shows a perspective and partly exploded view of a lens housing according to aspects of an embodiment of the disclosed subject matter; and, FIG. 13 illustrates schematically and in block diagram format a seed laser-amplifier laser system according to aspects of an embodiment of the disclosed subject matter.

The lens 25 may be mounted with the clamps (not shown in FIG. 1 or 3) in a flexure mount telescope lens well 54 adjacent a telescope lens opening 55, with the lens mounting clamps attached to the flexure mount body 24 by screws, as illustrated in FIG. 12 with respect to lens 26, and which may be threadedly inserted into telescope lens mounting screw openings 56, one or more of which may be contained within a flexured mounting 32d formed, by way of example, in the shape of a rectangular body attached to a relatively slender arm formed by a flexure mount slot 53d for flexibility of movement of the rectangular body in the vertical direction as illustrated in FIGS. 1 and 3 (it being understood that in actual operation the flexible movement of the rectangular body may not be aligned with any vertical axis, e.g., in relation to the earth). A rotational adjustment opening 58 (shown in FIG. 8) in the frame 50, may be utilized to allow an actuator, to rotate the mirror mount body 24 and along with it the lens 25. The actuator may be controllable by a through-the-wall actuation assembly, like that shown in FIG. 8 by way of example, from outside of a telescope assembly module enclosure 11. The telescope assembly module enclosure 11 may have a telescope module enclosure cover plate 12, within which may be mounted a telescope module 10 including as a portion thereof, the telescope optic rotational flexure mount 23. The flexured mount 24 may be used to adjust beam alignment in the multi-optical element, (e.g., two lenses 25, 26) optical assembly described herein.

Turning now to FIGS. 4 and 12, there is shown an opposing telescope lens mount body 30 which may have a frame 35 surrounding a telescope lens mounting well 36 within which may be mounted a lens 26, such as an $SiO_2$ 40×25.4 mm 75 mm radius 351 nm plano-convex recti-cylindrical lens 26, adjacent a lens opening 38. The lens 26 may form the other end of the telescope contained in the adjustable telescope assembly 20. The flexure mount 23 may form a part of the adjustable (telescoping) optical assembly 20 which may be a part of the telescope module 10. The telescope lens mount body 30 may include a plurality of mounting screw openings 148, several of which may be formed in a respective flexured mounting, such as, flexured mountings 32a, 32b and 32c, formed, by way of example with respective slots 53a, 53b and 53c, similar to the mounting flexure slot 53d on the flexure mounting plate 24, and which may allow for flexure movement of the lens mounting clamps 43 (shown in FIG. 12) also in a vertical axis, roughly the same as the axis for the flexure mount 32d, when the lens mounting plate 30 is assembled, again, relative to the vertical direction in FIG. 1, and not necessarily to any vertical axis, such as that in relation to the earth, during actual assembled operation.

Figure 7:
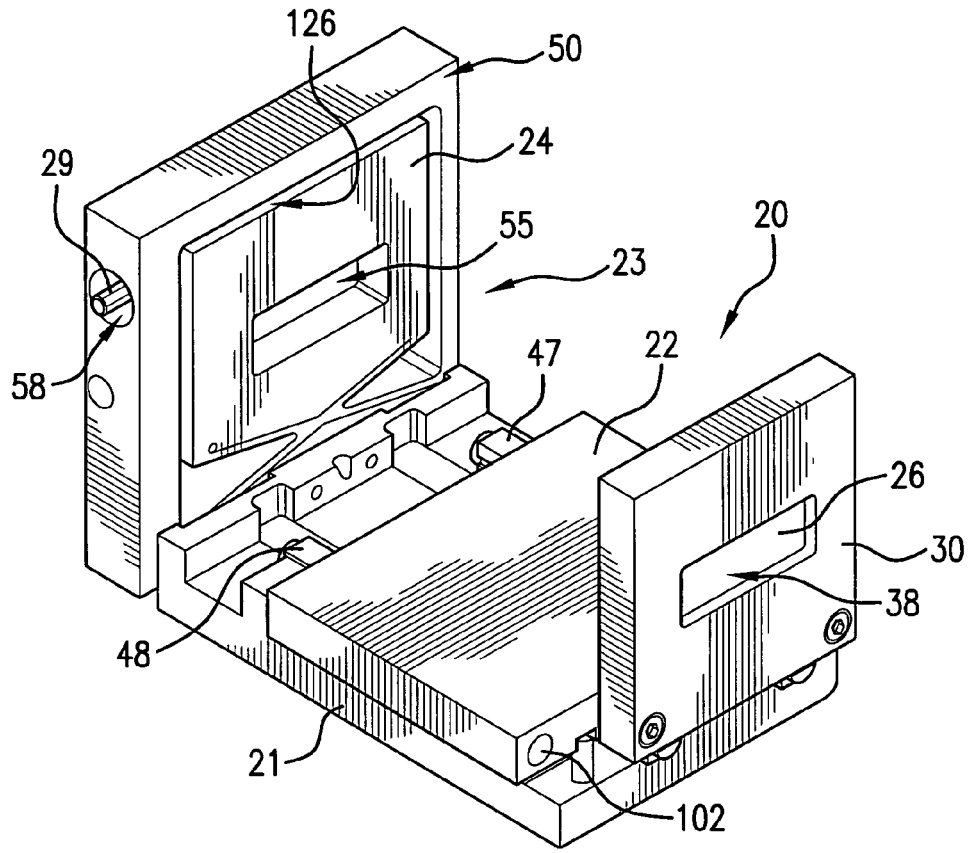
FIG. 7 shows a perspective and partly schematic view of an assembly of portions shown in FIGS. 1-4, according to aspects of an embodiment of the disclosed subject matter.

Turning now to FIG. 7, it can be seen that the mounting plates 23 may be attached to a telescope lens mount stage base 21, which may cooperate with a telescope lens mount stage front 22, to form the telescope lens adjustable (telescoping) optical assembly 20. The mounting plate 23 may be attached by way of example, to the base 21, and the mounting plate 30 may be attached to the front 22 with the front moveably positionable with respect to the base 21 against opposing spring pressure, as explained below, to position the two lenses 25, 26 with respect to each other along an optical axis of the telescope formed by the lenses 24, 25.

Turning now to FIG. 6, there is shown a perspective partly-exploded view of a turning mirror mount assembly 13, which may also be positioned in the enclosure 10. The turning mirror mount assembly 13 may include a turning mirror mount plate 14, upon which may be mounted an $SiO_2$ 351 maximum reflectivity S-polarized 45° mirror 15. The mirror 15 may be held in place on the mount plate 14 by a plurality of mirror mounting clips 43, which may be held in place by a respective nut 44. The mirror mounting nuts 44 may be received by a threaded nut receiving opening 46 formed in one of a plurality of flexured nut receptacles 210 on the mounting plate 14, similar to those described above.

The mount plate 14 may be attached to a mirror mount bracket 17, such as by a hex nut 200. The bracket 17 may be attached to a tilt plate 202, such as by hex nuts 204 and the tilt plate 202, and associated tilt mechanism 71 may be attached to the enclosure 10 wall by a hex nut 206, such that rotation of a respective ball tip adjustment screw 42, held in place by an adjustment screw nut 41, will tilt the tilt plate 202 in a respective one of two separate axes for adjustment of the pointing of the mirror 15.

Figure 8:
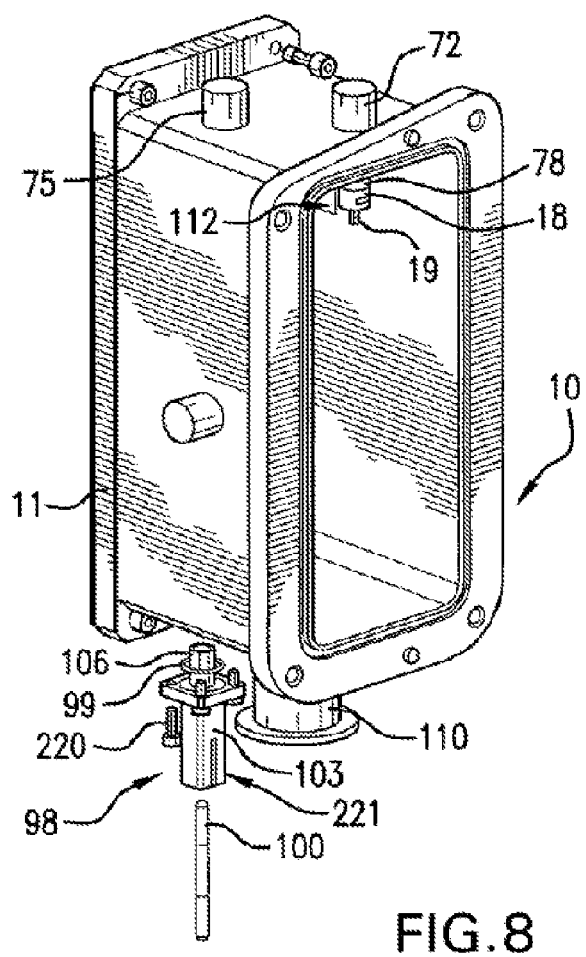
FIG. 8 shows a perspective and partly exploded view of an assembly housing according to aspects of an embodiment of the disclosed subject matter.

The ball tip adjustment screws 42 may be actuated, such as with through-the-wall actuators, such as that shown in FIG. 9. For example, the tip-tilt actuator optical mount 71 may be utilized to position the tilt plate 202 through the operation of one or both of the ball tip adjustment screws 42, by way of example using a through the wall actuator positioners 72, 76 (as shown in FIG. 5, and in more detail in FIG. 9). The actuator positioner, such as positioner 72, may include a through-the-wall adjustment shaft 78, which may be held in place with respect to the wall of the enclosure 10 with a locking nut 17. The shaft 78 may extend into a through-the-wall adjuster coupler collar 18, along with a through the wall adjuster hex plunger 19, and a compression spring 77, with the shaft 78 held in position in the collar, such as by a nut 70. In operation, the plunger 19, extending through an opening 76 in the collar 18, may engage a hex opening in the respective ball tip adjustment screw 42 to rotate the respective screw 42 and tilt the plate 202 with respect to the tilt mechanism 71 and in the respective axis. As illustrated in FIG. 8, each of the ball tip adjustment screws 42 may have a respective through the wall actuator positioner, such as positioner 72, which may be operated externally of the enclosure 10 by a respective through-the-wall actuator, such as those having through-the-wall actuation knobs 72, 75, one for each axis of tilt of the plate 202.

FIG. 8 also shows a form of through-the-wall actuator positioner 98 for the telescope lens separation control, discussed in more detail below. The actuator positioner 98 may have a seal 99, and may be attached to a through-the-wall actuator positioner opening by a plurality of nuts 220. The through-the-wall actuator positioner 98 may have a collar 106 extending into the enclosure 10, and a telescope adjustment screw 100 extending through the collar 106 and threadedly engaging either or both of the mount 98 or collar 99, and inside the enclosure 10 engaging the lens positioning mechanism front plate 22, e.g., at through-the-wall telescope positioning actuator receptor 102, to move the front plate 22 against the pressure of springs 60 to position the lens 24, with respect to the lens 25, along the axis of the telescope, as is discussed in more detail below. The adjustment screw 100 may be threaded in its central portion and may be viewed though a gauge opening 221 on the mount frame 103. The end of the adjustment screw 100 may move the stage front 22 and its attached lens mount plate 30 towards the mount plate 23 and its lens 25, which remains stationary and fixed to the lens mount base 21.

The enclosure 10 may have a beam exit passage 110 through which the seed beam pulses may pass in route to the amplifier laser, and a beam entry opening 112 through which the seed laser pulse beam may pass to the turning mirror 15 and thence, to the divergence and beam size/shape adjuster, such as the telescope contained within the enclosure 10.

Turning now to FIG. 2, the telescope flexure mount base 2 may include a pair of crossed roller linear motion railed guides 47, and crossed roller linear motion slotted guides 48, with the railed guides each having a respective rail 160 that slides in the slot 162 of its respective paired slotted guide 48. A pair of alignment dowels 140 aligned with a pair of alignment dowel receiving openings (not shown), may serve to align the flexured lens mount plate 23 to the base 21, for proper attachment of the mount plate 23 to the base 21, and an alignment dowel 142 sliding in an alignment dowel receiving slot 144, may serve to align the movement of the front plate 22 with the base 21, along with the action of the rails 160 sliding in the slots 162 of the guides 47, 48, so that the front plate 22 slides in proper alignment under the influence of the lens positioning screw 100 and against the force of the springs 60. The springs 60 may be attached to the base 21 by spring mount posts 150 attached to the base 21, and by similar posts (not shown) on the front plate 22.

Alignment dowels 140 on the front plate 22 serve to align the mounting of the lens mount plate 30 to the front plate 22.

The entire assembly may be seen as assembled in FIG. 7, which also illustrates an embodiment in which a lens rotational actuator screw 29 may extend through an actuator opening 58 in the frame 50 of the lens mount 23, and rotate the lens 25 in its rotational flexured mount 24, in order to make sure the lenses are aligned relative to the same optical axis and generally to the short axis of the beam exiting the laser/seed laser. The rotational alignment may be utilized to match the rotation angle of the beam as defined by the discharge chamber and the short axis of the beam due to effects in another part of the laser optical train, such as, the cylindrical lens of the center wavelength selection mirror (Rmax). The nature of the seed laser cavity may require, e.g., cylinder matching of the three axis's—Rmax to chamber discharge to telescope (lens assembly).

The adjustable telescope or telescope like optical assembly may be seen to be formed by the convex cylindrical lens 25 mounted in the flexured mount 24, having a lens opening 55, and the concave cylindrical lens 26, mounted on the positionable mount plate 30, having a lens opening 38. The attachment of the lens 26 to the positionable lens mount plate 30 is shown by way of example in FIG. 12, with its illustrated lens attachment nuts 44 engaged in receiving openings 148 in respective flexured mounting elements 32a, 32b and 32c and holding clips 45 or a tab 46, against the lens 26. The nuts 44 may also attach lens tabs 27 to the mount plate 30. The tabs 27 may serve to secure the lens against rotation or the like, in the mount plate. The lenses 25, 26 may be positioned such that the focusing of the convex cylindrical lens in one axis (e.g., the short axis) of the beam is truncated before the beam is focused, i.e., the concave cylindrical lens 26 is located before the focal plane of the convex lens 25.

Figure 10A:
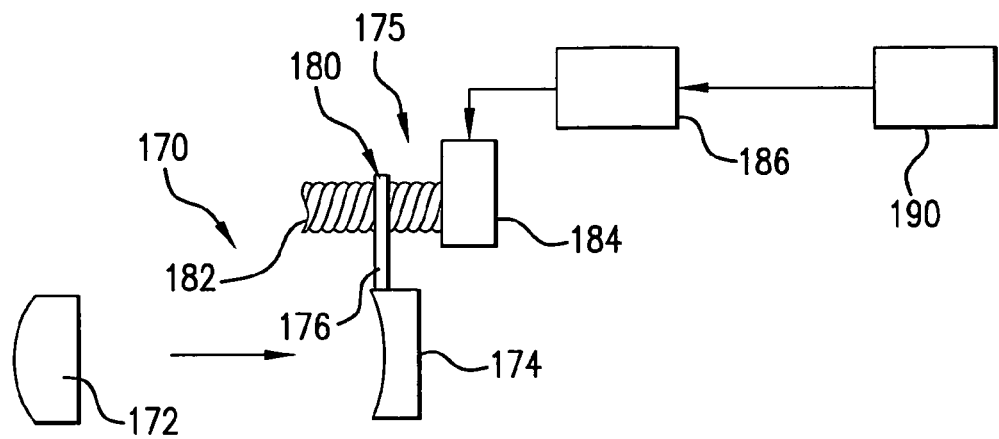
FIGS. 10A and 10B show partly schematic side views of examples of an actively adapted divergence control system according to aspects of an embodiment of the disclosed subject matter.
Figure 10B:
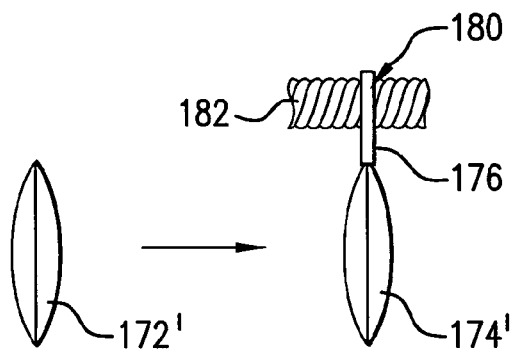

According to aspects of an embodiment of the disclosed subject matter, FIG. 10A illustrates schematically an actively adjustable telescope (lens arrangement) system 170, which may include a lens position adjustment mechanism 175, wherein, by way of example, a cylindrical lens pair 172, 174 may have one lens 174 positionable with respect to the other along the optical axis of the telescope system 170. The adjustment mechanism may comprise a lens attachment arm 176, which may have a threaded collar portion 180, which may threadedly engage a threaded shaft 182. A shaft actuator 184 may be controlled by a divergence/beam size and shape controller 186, which may receive feedback from a divergence sensor 190, or perhaps, as noted above, another type sensor, such as, a pulse energy monitor, or a beam profile detector, measuring, e.g., beam size and/or shape. FIG. 10B illustrates schematically, a similar arrangement with a pair of spherical lenses 172', 174'. In the embodiments of FIGS. 10A and B suitable mechanical attachment, flexure and the like elements, similar to those illustrated by way of example in more detail in FIGS. 1-9, may be utilized for positioning, alignment, vibration control, and the like.

Figure 11:
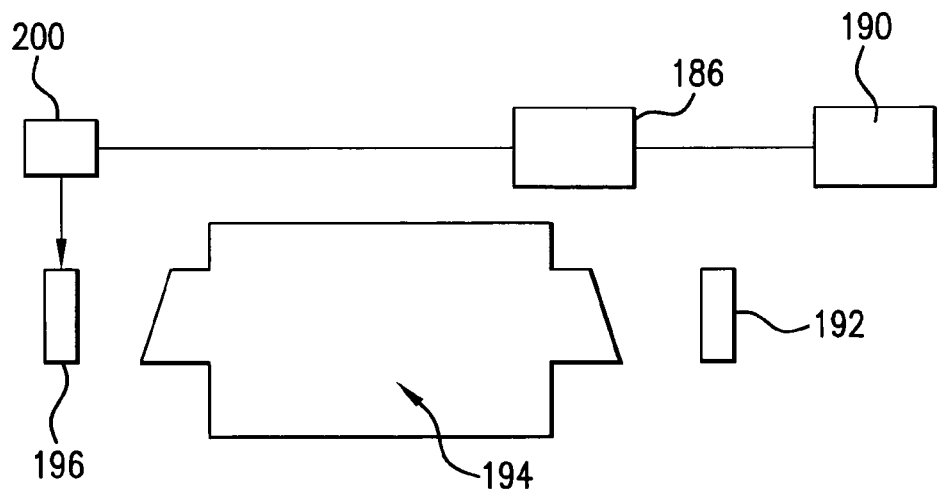
FIG. 11 shows a schematic view of an example of an active intra-cavity beam parameter control system according to aspects of an embodiment of the disclosed subject matter.

Turning now to FIG. 11, there is illustrated in schematic form, according to aspects of an embodiment of the disclosed subject matter, an intra-cavity divergence control system 200, for example, for use in a single-chamber laser system, such as an oscillator gas discharge laser, which may have an output coupler 192, a chamber 194, an adaptable rear mirror 196, and an adaptable rear mirror actuator 200, which may be controlled by a divergence controller 186 receiving input from a divergence sensor 190, or other metrology unit, such as a pulse energy detector. The adaptable mirror may be adjustable in position, such as, to change the length of the resonance cavity, i.e., the distance between the output coupler 192 and the mirror 196, or may be a multi-faceted mirror such as is discussed in one or more of the above-referenced patents/patent applications, including those owned by applicants' assignee Cymer, Inc. The adaptable mirror 196 could also be fabricated using semiconductor micro-electronic machine ("MEMs") technologies for the fabrication and ultimately positioning control of literally millions of tiny mirror facets for control of the likes of beam divergence out of the resonance cavity, or other beam wavefront characteristics.

Figure 13:
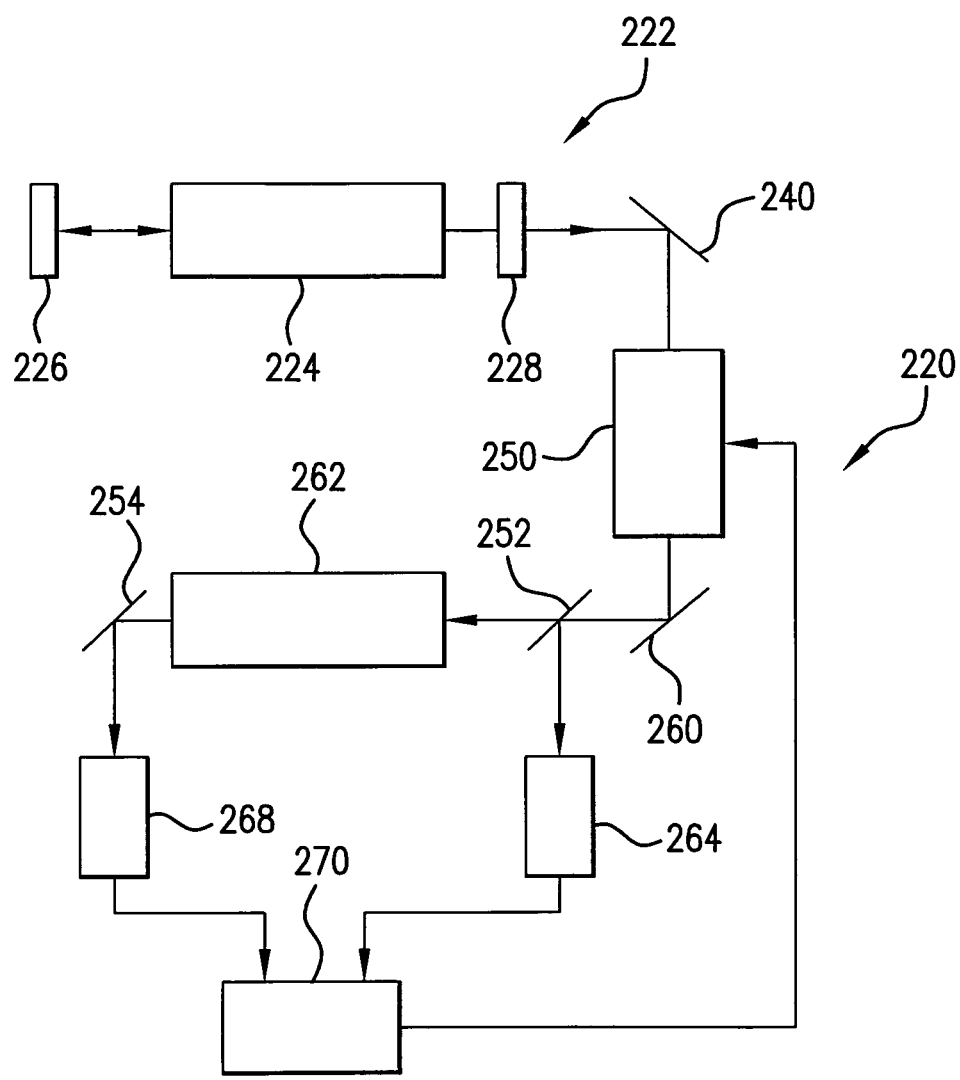

Turning now to FIG. 13, there is shown schematically, and in block diagram form, a seed laser/amplifier laser system 220 with active divergence/output pulse energy control. The laser system 220 may include a seed laser 222, such as a master oscillator, which may have a chamber 224 and a rear mirror 226. In the case where the divergence/beam size-shape control is utilized for pulse energy output control, the rear mirror 226 may be a line narrowing module, but in high power broadband applications it may be simply a rear reflector forming one end of the resonator cavity. The front mirror 228 may be a partially reflective output coupler mirror. The output of the resonator cavity may be turned by a maximally reflective (for the given wavelength) turning mirror 240 into a beam parameter control mechanism 250, such as a divergence/beam shape-size controller, which may be, by way of example the adjustable telescope as illustrated in FIGS. 1-9 and 12, or alternatively, in FIGS. 10A and 10B. Unlike at least the embodiments of FIGS. 1-9 and 12, the actuators of the embodiment illustrated in FIG. 13 may have rotary or linear stepper motors and/or deformable actuators, such as piezoelectric actuators, or the like, to manipulate the elements being actuated by the actuators, such as, in the case of the through-the-wall actuators described above, to actively control the positioning of, e.g., the lenses in the telescope, for such as divergence control and/or output pulse energy control, by control of the divergence of the beam entering the amplifier portion 262.

The amplifier portion may receive the seed beam which has passed through the divergence controller 250 by way of a maximally reflective turning mirror 260. The amplifier portion may comprise, as shown schematically in FIG. 13, a single pass amplifier, but could also be a multiple pass amplifier or even an amplifying oscillator. The control of the beam size and/or shape, wavefront and/or divergence or the like, entering the amplifier portion and thus the size, shape wavefront and/or divergence or the like, in the amplifying discharge region or a portion(s) thereof, can be used to control such aspects of system output beam parameters as pulse energy, pulse energy stability, beam divergence (collimation) and the like. This may be particularly advantageous in a laser annealing crystallization apparatus/process wherein the light source beam is greatly stretched in one dimension to form an elongated illumination beam, i.e., in the hundreds of millimeters long, and narrowed in an orthogonal dimension, e.g., to microns in length, for thin film crystallization, and also in such processes where dose stability may be critical pulse-to-pulse in the crystallization apparatus/process.

Divergence may be monitored, by way of example, at the input to the amplifier portion 262, such as by a divergence monitor 264 receiving a small portion of the seed beam by way of a beam splitter 252. Output pulse energy may similarly be monitored by a pulse energy monitor 268, receiving a small portion of the output of the amplifier portion 162. The outputs from the monitors 264, 268 may be provided to a beam parameter controller 270, which may be a portion of a larger laser system controller. Either or both of the outputs from the monitors 264, 268 may be utilized by the controller to provide divergence control feedback and/or other beam parameter control feedback, such as to control beam shape and/or size within the discharge region between the gas discharge electrodes in the amplifier portion 262. It will be understood by those skilled in the art, that the radius of curvature, separation of the lenses 25, 26 and the like, can be selected to first converge the seed laser output light pulse beam and then diverge it, leaving the beam dimension in the axis (axes in the case of a cylindrical lens) of the convergence/divergence relative unchanged, and modifying the divergence of the beam in the amplifier laser discharge region to counteract the lensing effect of the discharge in the amplifier laser to therefore, produce from the output of the amplifier laser, a collimated or more closely collimated amplifier laser output beam. Such an adjustable telescope, therefore, is unlike the prior art spatial filter lens arrangements, which, e.g., focus the beam, e.g., at an aperture between the lenses. The shape of the beam in the amplifier gain medium during the amplifier gas discharge wholly or at least approximately counteracts the lensing effect of the discharge region.

It will be understood by those skilled in the art that the discharge gases intermediate the electrodes in the seed laser or amplifier laser may have a lensing effect on the original seed beam, or on the beam as amplified, due, for example, to the dynamics of the gases in the discharge reacting to the electric discharge between the electrodes. This may cause an increase in the amplifier laser of any divergence already present in the beam entering the amplifier laser, e.g., in the horizontal or short axis of the beam, essentially orthogonal to the direction of the beam from electrode to electrode. A divergence adjusting mechanism according to aspects of possible embodiments of the disclosed subject matter may actually change the convergence of the beam entering the amplifier laser for wavefront shape changing.

Other telescopes, e.g., mono-axis, cylindrical (or spherical) telescopes, such as refractive and/or reflective or catadioptric, may be used for the basic multi-optical element optical assembly according to aspects of embodiments of the disclosed subject matter. Indeed, it is almost a misnomer to refer to the adjustable lens arrangement described above, according to aspects of an embodiment of the disclosed subject matter, as a telescope, since little focusing of the beam occurs between the lenses, the object being to focus the beam slightly then expand the beam, such that the relative size (length/diameter) at least in the axis(es) affected by the lens arrangement does not change much, but the wavefront is modified to be essentially the inverse of a wavefront that would result if, e.g., a fully collimated beam entered the amplifier laser discharge region and was distorted by the lensing effect of anomalies in the homogeneity of the discharge region during formation of the charged gas, resulting in the population inversion that accommodates amplified stimulated emission in the amplifier so that a generally collimated beam emerges from the amplifier laser. This focusing and beam shaping also positively impacts the pulse energy of the output of the amplifier laser and with active feedback control can maintain the beam wavefront out of the amplifier laser and can also impact pulse energy stability.

The size, shape, wavefront and/or divergence, or the like, in the discharge region, effective to counteract the lensing effects in the amplifier during the discharge of the amplifier laser resulting in unwanted divergence effects in the optics downstream of the amplifier laser may be difficult, if not impossible, to measure directly. Those skilled in the art will understand that such things are affected by the size, shape, wavefront and/or divergence or the like, of the seed laser output pulse beam existing seed laser, the size, shape and arrangement of the adjustable multi-optical element optical assembly, e.g., the type and order of lenses (cylindrical, spherical, converging then diverging, or vice-versa, etc.), the radius of curvature of the lenses, the distance between the exit of the adjustable optical assembly (telescope) and the discharge region of the amplifier laser, and the like.

Those skilled in the art will understand how to select the appropriate sizes, shapes, positions, separations etc., for the adjustable optical assembly and its associated component parts to attain a beam output of the amplifier laser that is most suitable to the downstream optics, such as in a laser annealing crystallization apparatus, i.e., collimated or nearly so, if such is desired, or other wavefront, if such is desired. This may be done in either a set-and-forget system, or a periodically modified (e.g., lens separation changed) system, which, with appropriate feedback control, might even be pulse to pulse, or at least based on feedback determined from some immediately preceding or generally immediately preceding pulse(s) for control of a generally immediately upcoming pulse or pulses, determined by the speed of the available metrology and actuation mechanisms controlling such as the lens separation. That is, the system may be a set-and-forget system, set at time of manufacture/installation and only modified (e.g., lens separation) relatively infrequently in the field, or an actively feedback controlled system, responding as frequently as possible within the bounds of the metrology and actuator technology available, as laser system/annealing optics system conditions change, such as, e.g., changes in gas mixture/entrained debris in the laser or thermal transients in the laser or downstream optics, either keyed by lapse of time, or duty cycle changes or the like, etc.

It will be understood that aspects of the disclosed subject matter can be utilized with a multiple pas power amplifier such as exists in applicants' assignee's XLA-XXX series of MOPA seed laser/amplifier laser systems, though the optics may be somewhat more complex to achieve what applicants believe to be the results of a more simple single pass amplifier laser gain medium. Also, the amplifier probably will not preserve the desirable results of shaping the beam within the discharge region of the amplifier laser, according to aspects of embodiments of the disclosed subject matter if the amplifier is an oscillator. Divergence of the seed beam may be exacerbated where the seed laser is an unstable resonator, such as may be employed in high power laser annealing light sources, particularly those providing light to an optical system that needs to greatly expand the length of the laser light beam in one dimension, such as, for effective flat panel film annealing.

It will be understood that according to aspects of an embodiment of the disclosed subject matter the detrimental effects to the optics in the annealing apparatus may be modified in two axis, generally orthogonal to each other, by using two cylindrical lens arrangements, generally orthogonal to each other.

According to aspects of an embodiment of the disclosed subject matter, the actuators to control such variables as the distance between lenses, such as lenses 24 and 25 in the adjustable telescope, or the tilt applied to one or more of the lenses, may have manually adjusted positioners, such as the through-the-wall adjusters shown in FIGS. 5-8. Such may be in a set-and-forget arrangement, which may be adjusted, by way of example only, each time the laser system optics are aligned, such as, initially in the factory, or realigned in the field. In such an arrangement, a divergence monitor may be needed as only a test metrology instrument, and not form part of the permanent laser system equipment utilized while the laser system is in operation in the field. Alternatively, the actuators or some of them, may be actively controlled based on feedback from metrology units, such as one or more of an installed divergence meter and/or an output pulse energy detector. As an example, without an installed divergence meter, the control of the divergence adjustment mechanism, such as the position of the lenses in the telescope, may be controlled based on feedback to a controller from the output pulse power meter, without regard to actual measurement of divergence, to adjust divergence and beam shape and/or size of the seed laser seed pulse beam, such as, for purposes of controlling output pulse energy.

It will also be understood by those skilled in the art, that the best place to position a divergence adjusting mechanism, such as the adjustable lens arrangement (telescope) discussed in the present application, which may be intermediate the seed laser and amplifier laser, and as close as possible to the output coupler of the seed laser. However, design considerations, such as existing modules and containment enclosures and the like, may dictate a less than optimal, but still acceptable, positioning of the divergence adjusting mechanism. Thus, for example, the divergence adjusting mechanism could be located between the output coupler and first turning mirror illustrated schematically in FIG. 13, and perhaps ideally so, since the modification of the size, shape, wavefront and/or divergence or the like, of the seed laser output pulse beam may benefit from the greater distance to the amplifier discharge region to become better effective. Therefore, the divergence control/pulse energy control mechanism of the disclosed subject matter, may operate best closer to the output of the seed laser, i.e., the output coupler.

As used herein, the term telescope may be understood to be possibly broader than a strict technical definition of telescope, and may include telescope-like optical systems that do not necessarily bring the image to a focus/focal plane intermediate multiple lenses/mirrors/mirrors and lenses in the system. Rather, as will be understood by those skilled in the art, the optical assembly may simply function as noted above, e.g., as a positive/convex lens to narrow the beam somewhat followed by a negative/concave lens to first narrow the beam and then expand it, e.g., toward collimation in order to adjust the beam size and wavefront as it passes through the discharge region in the amplifier laser to ultimately get a wavefront, such as a more collimated wavefront out of the amplifier laser or at some point in the optical path downstream of the amplifier laser, counteracting distortions of the beam wavefront (or size and shape, or the like) as it exits the amplifier laser. Alternatively as will be understood by those skilled in the art a negative lens followed by a positive lens could effectively be used as well.

It will be understood by those skilled in the art that the aspects of embodiments of the disclosed subject matter are intended to be possible embodiments or portions of possible embodiments only, and not to limit the disclosure of the disclosed subject matter in any way and particularly, not to a specific possible embodiment or portion of a possible embodiment alone. Many changes and modifications can be made to the disclosed aspects of embodiments of the disclosed subject matter that will be understood and appreciated by those skilled in the art. The appended claims are intended in scope and meaning to cover not only the disclosed aspects of embodiments of the disclosed subject matter, but also such equivalents and other modifications and changes that would be or become apparent to those skilled in the art. In addition to changes and modifications to the disclosed and claimed aspects of embodiments of the disclosed subject matter, others could be implemented.

We claim:

1. An apparatus comprising:
   a gas discharge seed laser providing a seed laser output pulse;
   a gas discharge amplifier laser amplifying the seed laser output pulse, producing an amplified seed laser output pulse;
   a divergence correction multi-optical element optical assembly adjustable to vary beam divergence of the seed laser output pulse amplifier to improve at least one property of amplified seed laser output pulse, the divergence correction multi-optical element optical assembly including:
   a first optical element mounted in a lens mount; and
   a second optical element mounted in a rotational flexured mount wherein the first optical element and the second optical element are aligned relative to a selected optical axis and wherein the rotational alignment of the rotational flexured mount matches a rotational angle of the beam, wherein the rotational alignment of the flexured mount rotates around an axis of rotation passing through a single point of rotation in the flexured mount, wherein the flexured mount includes:
   a frame triangular protuberance defined by a first slot disposed along a first angled side of the frame triangular protuberance and a second slot disposed along a second angled side of the frame triangular protuberance; and
   a solid intermediate point separating the first slot and the second slot wherein the slots virtually cross each other at the single point of rotation.

2. The apparatus of claim 1 further comprising: the property comprising amplified seed laser output pulse energy.

3. The apparatus of claim 1 further comprising: the property comprising amplified seed laser output pulse beam divergence.

4. The apparatus of claim 1 further comprising: the optical assembly varying the size and/or shape of the seed laser output pulse within a discharge region of the amplifier laser to improve at least one property of amplified seed laser output pulse.

5. The apparatus of claim 1 further comprising: the optical assembly comprising two optical elements and adjustment is made by moving one optical element relative to the other optical element.

6. The apparatus of claim 4 further comprising: the optical assembly comprising two optical elements and adjustment is made by moving one optical element relative to the other optical element.

7. The apparatus of claim 5 further comprising: one optical element comprising a focusing optical element and the other optical element comprising a collimating optical element.

8. The apparatus of claim 6 further comprising: one optical element comprising a focusing optical element and the other optical element comprising a collimating optical element.

9. The apparatus of claim 7 further comprising: the focusing optical element and the collimating optical elements each comprising a lens.

10. The apparatus of claim 8 further comprising: the focusing optical element and the collimating optical elements each comprising a lens.

11. The apparatus of claim 1 further comprising: a monitor measuring a light parameter of the amplified seed laser output pulse exiting the amplifier laser and providing a signal indicative of the parameter to adjust the optical assembly.

12. The apparatus of claim 2 further comprising: a monitor measuring a light parameter of the amplified seed laser output pulse exiting the amplifier laser and providing a signal indicative of the parameter to adjust the optical assembly.

13. The apparatus of claim 3 further comprising: a monitor measuring a light parameter of the amplified seed laser output pulse exiting the amplifier laser and providing a signal indicative of the parameter to adjust the optical assembly.

14. The apparatus of claim 1 further comprising: the property comprising wavefront.

15. The apparatus of claim 1 further comprising: the optical assembly comprising a means for modifying a multi-mode beam.

16. The apparatus of claim 2 further comprising: the optical assembly comprising a means for modifying a multi-mode beam.

17. The apparatus of claim 3 further comprising: the optical assembly comprising a means for modifying a multi-mode beam.

18. The apparatus of claim 1 further comprising: the optical assembly comprising a beam twisting optical element.

19. The apparatus of claim 2 further comprising: the optical assembly comprising a means for twisting the optical element.

20. The apparatus of claim 3 further comprising: the optical assembly comprising a means for twisting the optical element.

21. The apparatus of claim 11 further comprising: the monitor comprising a Hartman-Shack divergence monitor.

22. The apparatus of claim 12 further comprising: the monitor comprising a Hartman-Shack divergence monitor.

23. The apparatus of claim 13 further comprising: the monitor comprising a Hartman-Shack divergence monitor.

24. An apparatus comprising:
a gas discharge seed laser comprising a resonance cavity and providing a seed laser output pulse;
a gas discharge amplifier laser amplifying the seed laser output pulse to provide an amplified seed laser output pulse output;
a divergence correcting optical assembly disposed within the cavity and adjustable to vary the beam divergence of a seed laser output pulse entering the amplifier to improve at least one property of amplified seed laser output pulse output of the amplifier laser, the divergence correction multi-optical element optical assembly including:
a first optical element mounted in a lens mount; and
a second optical element mounted in a rotational flexured mount wherein the first optical element and the second optical element are aligned relative to a selected optical axis and wherein the rotational alignment of the rotational flexured mount matches a rotational angle of the beam, wherein the rotational alignment of the flextured mount rotates around an axis of rotation passing through a single point of rotation in the flextured mount, wherein the flextured mount includes:
a frame triangular protuberance defined by a first slot disposed along a first angled side of the frame triangular protuberance and a second slot disposed along a second angled side of the frame triangular protuberance; and
a solid intermediate point separating the first slot and the second slot wherein the slots virtually cross each other at the single point of rotation.

25. The apparatus of claim 24 further comprising: the adjustable optical assembly comprising an optical element comprising a deformable surface.

26. An apparatus comprising:
a gas discharge seed laser providing a seed laser output pulse;
a gas discharge amplifier laser amplifying the seed laser output pulse to provide an amplified seed laser output pulse output of the amplifier laser;
a divergence correction multi-optical element optical assembly intermediate to the seed laser and the amplifier laser adjustable to vary beam divergence of a seed laser output pulse beam entering the amplifier laser to improve at least one property of amplified seed laser output pulse output of the amplifier laser, the divergence correction multi-optical element optical assembly including:
a first optical element mounted in a lens mount; and
a second optical element mounted in a rotational flexured mount wherein the first optical element and the second optical element are aligned relative to a selected optical axis and wherein the rotational alignment of the rotational flexured mount matches a rotational angle of the beam, wherein the rotational alignment of the flextured mount rotates around an axis of rotation passing through a single point of rotation in the flextured mount, wherein the flextured mount includes:
a frame triangular protuberance defined by a first slot disposed along a first angled side of the frame triangular protuberance and a second slot disposed along a second angled side of the frame triangular protuberance; and
a solid intermediate point separating the first slot and the second slot slots virtually cross each other at the single point of rotation.

27. The apparatus of claim 26 further comprising: the optical assembly comprises a set and forget arrangement.

28. The apparatus of claim 27 further comprising: the optical assembly comprises a feedback controlled active adjustment mechanism.

29. The apparatus of claim 26 further comprising:
a light property monitor monitoring the at least one light property and providing a signal for feedback control;
the adjustment mechanism is responsive to the feedback control signal to adjust the adjustable optical assembly.

30. The apparatus of claim 29 further comprising: the property comprising pulse energy.

31. The apparatus of claim 29 further comprising: the property comprising wavefront.

32. The apparatus of claim 29 further comprising: the property comprising divergence.

33. The apparatus of claim 30 further comprising: the property comprising pulse energy.

* * * * *